US009236106B2

(12) United States Patent  (10) Patent No.: US 9,236,106 B2
Nakamura  (45) Date of Patent: Jan. 12, 2016

(54) MAGNETIC DOMAIN WALL MOTION MEMORY AND WRITE METHOD FOR THE SAME

(71) Applicant: KABUSHIKI KAISHA TOSHIBA, Tokyo (JP)

(72) Inventor: Shiho Nakamura, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/478,742

(22) Filed: Sep. 5, 2014

(65) Prior Publication Data

US 2015/0078071 A1  Mar. 19, 2015

(30) Foreign Application Priority Data

Sep. 19, 2013  (JP) ................................. 2013-194185

(51) Int. Cl.
| | |
|---|---|
| G11C 11/14 | (2006.01) |
| G11C 11/16 | (2006.01) |
| G11C 19/08 | (2006.01) |
| G11C 5/06 | (2006.01) |

(52) U.S. Cl.
CPC ............ *G11C 11/1675* (2013.01); *G11C 5/063* (2013.01); *G11C 11/161* (2013.01); *G11C 19/0808* (2013.01); *G11C 19/0841* (2013.01)

(58) Field of Classification Search
CPC .................................................. G11C 19/0808
USPC .......................................................... 365/81
See application file for complete search history.

(56) References Cited

U.S. PATENT DOCUMENTS 6,834,005 B1  12/2004  Parkin
6,898,132 B2   5/2005  Parkin
(Continued)

FOREIGN PATENT DOCUMENTS

JP  2010-161362  7/2010
JP  2012-174897  9/2012
JP  2013-080748  5/2013

OTHER PUBLICATIONS

Yamaguchi et al.; "Real-Space Observation of Current-Driven Domain Wall Motion in Submicron Magnetic Wires", The American Physical Society, Physical Review Letters, vol. 92, No. 7, pp. 077205-1-077205-4, (2004).

(Continued)

*Primary Examiner* — Son Mai
(74) *Attorney, Agent, or Firm* — Finnegan, Henderson, Farabow, Garrett & Dunner, L.L.P.

(57) ABSTRACT

A magnetic domain wall motion memory according to an embodiment includes: a magnetic memory nanowire; a write magnetic wire intersecting with the magnetic memory nanowire; an intermediate joining portion provided in an intersection region between the write magnetic wire and the magnetic memory nanowire; adjacent pinning portions placed on one of the same side and the opposite side of the write magnetic wire as and from the magnetic memory nanowire; a read unit attached to the magnetic memory nanowire; a pair of first electrodes that applies a write current to the write magnetic wire; and a pair of second electrodes that applies a current for causing the magnetic memory nanowire to move a magnetic domain wall, wherein contact faces of the write magnetic wire in contact with the adjacent pinning portions have magnetization configurations antiparallel to each other.

20 Claims, 13 Drawing Sheets

(56) References Cited

U.S. PATENT DOCUMENTS

| | | | | |
|---|---|---|---|---|
| 7,859,881 | B2* | 12/2010 | Iwata | G11C 5/02 365/130 |
| 7,952,905 | B2 | 5/2011 | Hwang et al. | |
| 8,233,305 | B2 | 7/2012 | Lee et al. | |
| 8,270,197 | B2* | 9/2012 | Lee | G11C 19/0841 365/148 |
| 8,363,461 | B2* | 1/2013 | Suzuki | G11C 11/15 365/158 |
| 2008/0239785 | A1* | 10/2008 | Gaidis | B82Y 10/00 365/87 |
| 2010/0172169 | A1 | 7/2010 | Lee et al. | |
| 2011/0149649 | A1* | 6/2011 | Hwang | G11C 11/15 365/173 |
| 2012/0211811 | A1 | 8/2012 | Nagahara et al. | |
| 2013/0083595 | A1 | 4/2013 | Nakamura et al. | |
| 2014/0085970 | A1* | 3/2014 | Kondo | G11C 11/161 365/158 |
| 2014/0119111 | A1* | 5/2014 | Nakamura | H01L 43/08 365/171 |

OTHER PUBLICATIONS

Parkin; "Data in the Fast Lanes of Racetrack Memory", Scientific American, Inc., pp. 76-81, (Jun. 2009).

* cited by examiner

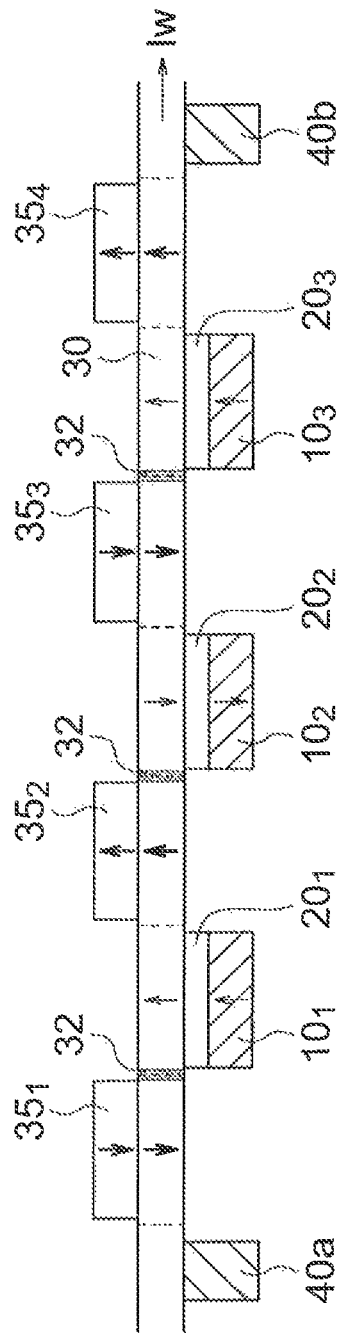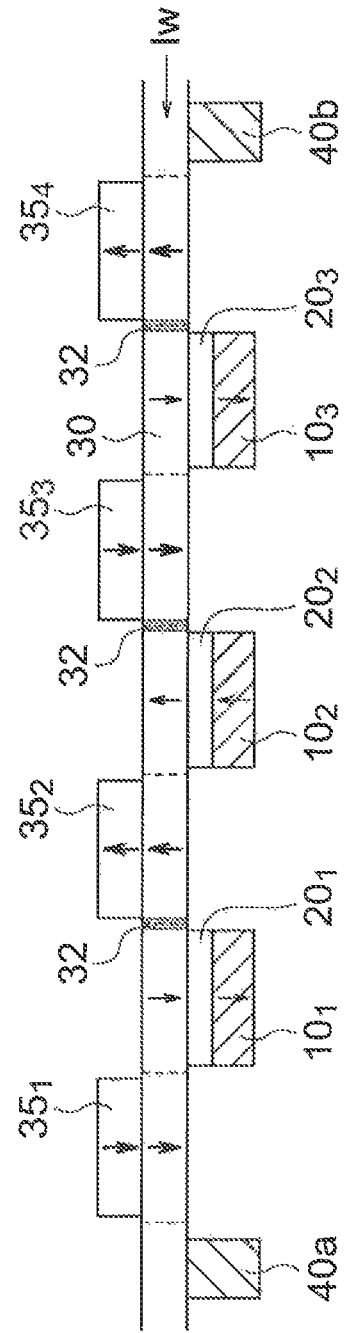

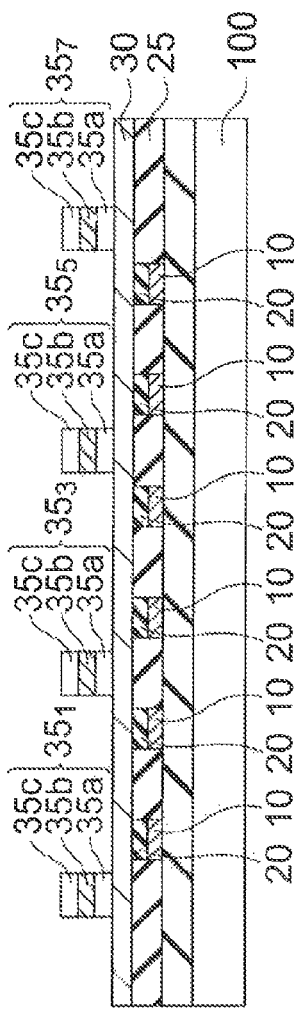
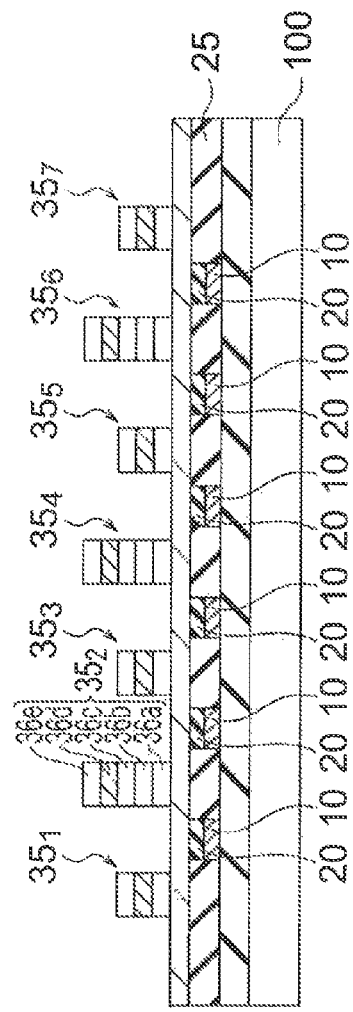
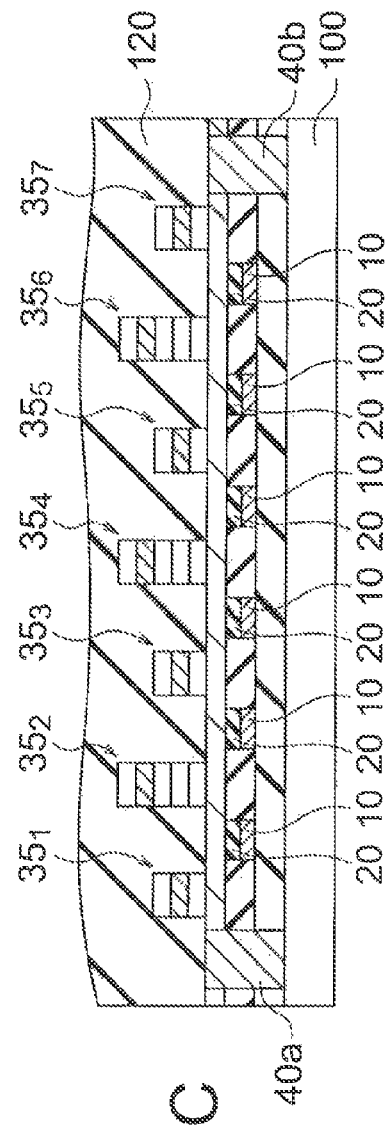
FIG. 12A
FIG. 12B
FIG. 12C

MAGNETIC DOMAIN WALL MOTION MEMORY AND WRITE METHOD FOR THE SAME

CROSS-REFERENCE TO RELATED APPLICATION

This application is based upon and claims the benefit of priority from prior Japanese Patent Application No. 2013-194185 filed on Sep. 19, 2013 in Japan, the entire contents of which are incorporated herein by reference.

FIELD

Embodiments described herein relate generally to magnetic domain wall motion memories and write methods for the magnetic domain wall motion memories.

BACKGROUND

In recent years, there have been reports that magnetic domain walls driven by a current were observed in magnetic nanowires having submicron widths. Magnetic domain wall motion memories that are capable of moving magnetic domain walls by utilizing this effect have been suggested. In such a magnetic domain wall motion memory, magnetic nanowires (magnetic memory nanowires) each divided into magnetic domains are used, and information (data) "0" or "1" corresponding to the magnetization directions of the magnetic domain walls is stored. Since the magnetic domains move as the magnetic domain walls move when a current is applied, the information (data) stored in the magnetic domains also moves. Accordingly, the information can be read with a stationary sensor, and can be written with a stationary write unit. That is, the magnetic domain walls are equivalent to memory cells.

In general, there is an increasing demand for magnetic memories having larger capacities with higher cell densities, and there is also an increasing demand for reductions in power consumption.

Specific examples of write methods for the magnetic domain wall motion memories include: a write method utilizing a magnetic field that is generated around a wire different from the magnetic memory nanowires by applying a current to the different wire; a method of writing with spin transfer torque by utilizing magnetic tunnel junctions formed in some of the magnetic memory nanowires; and a write method by which a pair of pinning portions having opposite magnetization directions are provided for each magnetic memory nanowire and are located in the same plane as the magnetic memory nanowires, and magnetic domain walls are moved by applying a current to wires provided for the respective pinning portions. However, these write methods have yet to overcome the difficulties in lowering power consumption and increasing capacities. Therefore, there is still a demand for reductions in power consumption and writing with larger capacities.

BRIEF DESCRIPTION OF THE DRAWINGS

FIGS. 3(a) and 3(b) show diagrams for explaining a write operation in the magnetic domain wall motion memory of the embodiment;

FIGS. 12(a) through 12(c) are cross-sectional views for explaining procedures according to the method of manufacturing the magnetic domain wall motion memory of the embodiment.

DETAILED DESCRIPTION

A magnetic domain wall motion memory according to an embodiment includes: a magnetic memory nanowire; a write magnetic wire intersecting with the magnetic memory nanowire; an intermediate joining portion provided in an intersection region between the write magnetic wire and the magnetic memory nanowire, the intermediate joining portion transferring, to the magnetic memory nanowire, information about magnetization of the write magnetic wire in the intersection region; adjacent pinning portions placed on one of the same side and the opposite side of the write magnetic wire as and from the magnetic memory nanowire, the adjacent pinning portions being in contact with the write magnetic wire, the adjacent pinning portions having the magnetic memory nanowire interposed therebetween when projected onto the write magnetic wire, the adjacent pinning portions being located at a distance from each other, the distance being equal to or longer than a width of the magnetic memory nanowire in a direction parallel to an extending direction of the write magnetic wire; a read unit attached to the magnetic memory nanowire; a pair of first electrodes that applies a write current to the write magnetic wire, the first electrodes being attached to the write magnetic wire in such a manner that the magnetic memory nanowire and the adjacent pinning portions are interposed between the first electrodes when projected onto the write magnetic wire; and a pair of second electrodes that applies a current for causing the magnetic memory nanowire to move a magnetic domain wall, the second electrodes being attached to the magnetic memory nanowire, wherein contact faces of the write magnetic wire in contact with the adjacent pinning portions have magnetization configurations antiparallel to each other.

The following is a detailed description of embodiments, with reference to the accompanying drawings.

Figure 1:
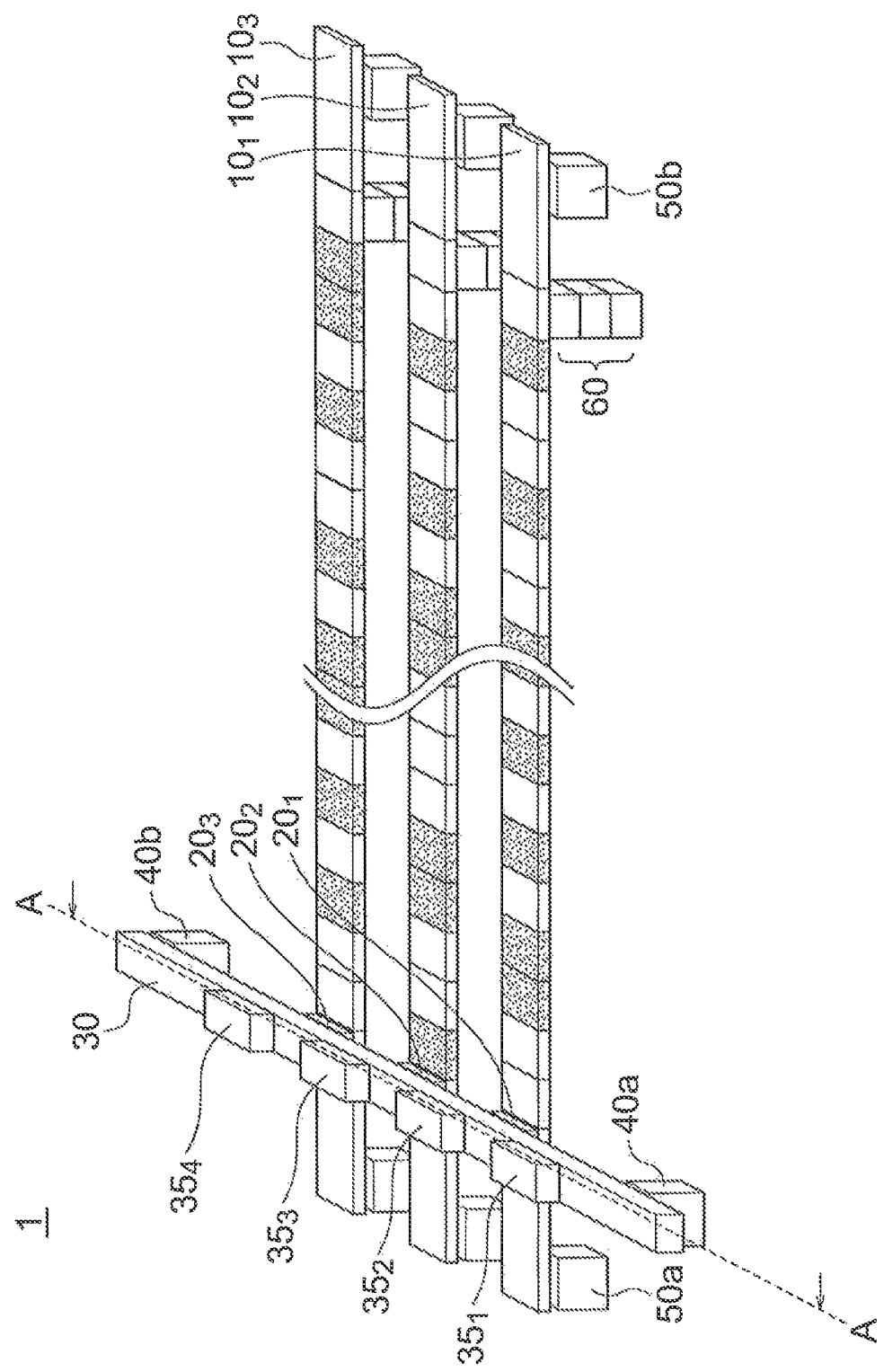
FIG. 1 is a perspective view of a magnetic domain wall motion memory according to an embodiment.
Figure 2:
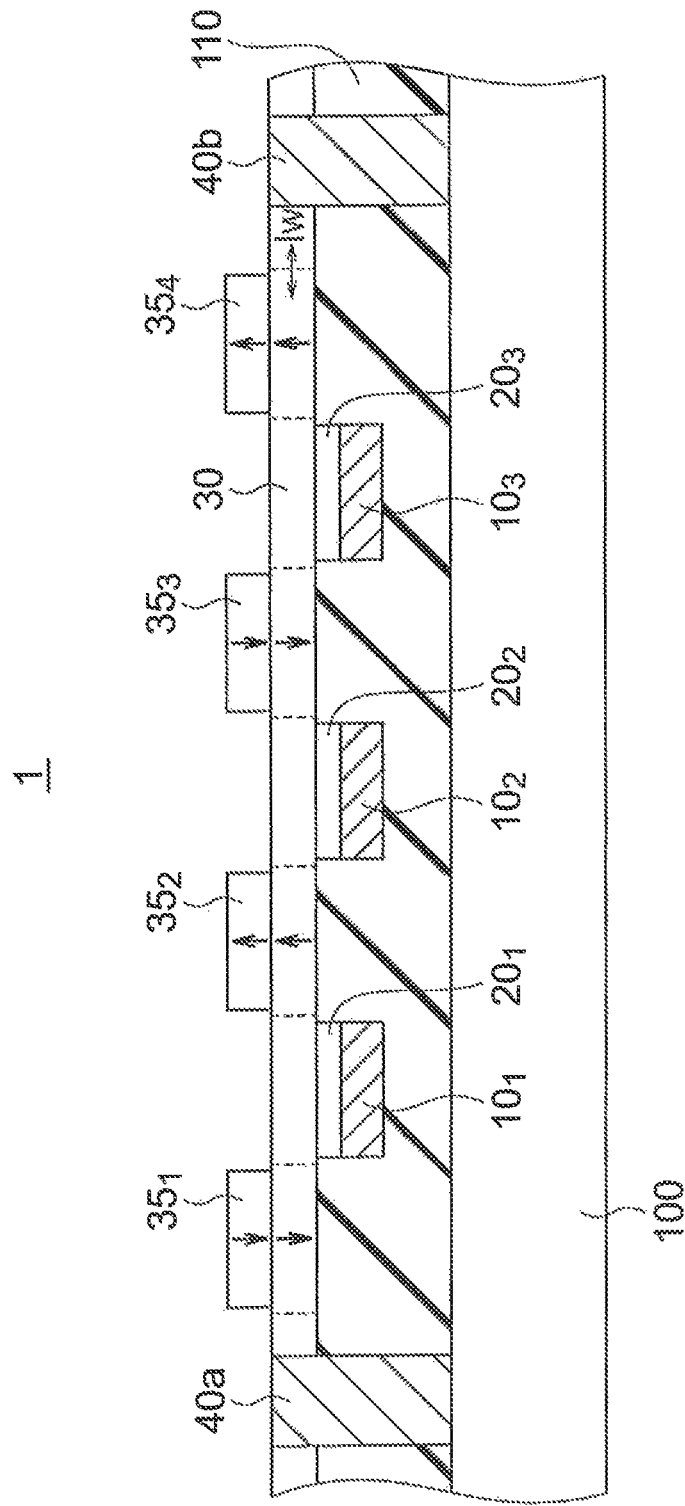
FIG. 2 is a cross-sectional view of the magnetic domain wall motion memory of the embodiment, taken along the section line A-A defined in FIG. 1.

Referring to FIGS. 1 and 2, a magnetic domain wall motion memory according to an embodiment is described. FIG. 1 is a perspective view of a magnetic domain wall motion memory 1 of this embodiment. FIG. 2 is a cross-sectional view of the magnetic domain wall motion memory 1 of this embodiment, taken along the section line A-A defined in FIG. 1.

The magnetic domain wall motion memory 1 of this embodiment includes: N (N≥1) magnetic memory nanowires $10_1$, $10_2$, and $10_3$ that function as storage elements located above a substrate 100 having an integrated circuit mounted thereon, and extend parallel to one another; a write magnetic wire 30 located so as to be intersecting with those magnetic memory nanowires $10_1$, $10_2$, and $10_3$; intermediate joining portions $20_1$, $20_2$, and $20_3$ located between the write magnetic wire 30 and the respective magnetic memory nanowires $10_1$, $10_2$, and $10_3$; and (N+1) pinning portions $35_1$, $35_2$, $35_3$, and $35_4$ in contact with the write magnetic wire 30. Although N is 3 in FIGS. 1 and 2, N may be greater than 3. The substrate 100 having an integrated circuit mounted thereon is covered with an insulating film 110, and the magnetic memory nanowires $10_1$, $10_2$, and $10_3$ are placed on the insulating film 110. Each magnetic memory nanowire $10_i$ (i=1, 2, or 3) extends in one direction. Extending in one direction means extending in one direction in some part of each magnetic memory nanowire $10_i$ (i=1, 2, or 3), and does not mean extending in one direction in the entire area of each magnetic memory nanowire $10_i$ (i=1, 2, or 3). Therefore, an example described below is a case where each magnetic memory nanowire $10_i$ (i=1, 2, or 3) is placed on a substrate, and a first portion extending upward, a second portion that is connected to the first portion and extends parallel to the substrate, and a third portion that is connected to the second portion and extends downward are provided, as in the later described magnetic domain wall motion memory of the modification shown in FIG. 6. In this case, each magnetic memory nanowire $10_i$ (i=1, 2, or 3) extends in one direction in each of the portions or in some part, but does not extend in the same direction in all the portions or does not extend in one direction in the entire area. Still, it is referred to as each magnetic memory nanowire $10_i$ (i=1, 2, or 3) extending in one direction in this specification.

Adjacent pinning portions $35_i$ and $35_{i+1}$ (i=1, 2, or 3) are arranged to have a magnetic memory nanowire $10_i$ interposed therebetween when the pinning portions $35_i$ and $35_{i+1}$ and the magnetic memory nanowire $10_i$ are projected onto a plane perpendicular to the direction in which the magnetic memory nanowire $10_i$ and the write magnetic wire 30 are stacked. In this case, the adjacent pinning portions $35_i$ and $35_{i+1}$ are located at a distance equal to or longer than the width of the magnetic memory nanowire $10_i$ from each other, and are in contact with the write magnetic wire 30. The pinning portion $35_2$ is located between the two adjacent magnetic memory nanowires $10_1$ and $10_2$, and the pinning portion $35_3$ is located between the two adjacent magnetic memory nanowires $10_2$ and $10_3$. The pinning portions $35_i$ and $35_{i+1}$ (i=1, 2, or 3) are designed to define magnetization directions in the regions of the write magnetic wire 30 in contact with the pinning portions $35_i$ and $35_{i+1}$ so that the magnetization directions become antiparallel to each other. The adjacent pinning portions $35_i$ and $35_{i+1}$ (i=1, 2, or 3) each include a layer in contact with the write magnetic wire 30, and these layers are formed with ferromagnetic materials or antiferromagnetic materials having magnetization configurations antiparallel to each other therein. In FIG. 2, each pinning portion $35_i$ (i=1, 2, 3, or 4) is formed with a ferromagnetic layer.

Further, a pair of electrodes 40a and 40b for applying a write current to the write magnetic wire 30 are provided in positions between which the N magnetic memory nanowires $10_1$, $10_2$, and $10_3$, and the (N+1) pinning portions are interposed, and a pair of electrodes 50a and 50b for bit shifts are provided for each magnetic memory nanowire $10_i$ (i=1, 2, or 3). A read unit 60 is also provided for each magnetic memory nanowire $10_i$ (i=1, 2, or 3).

Referring now to FIGS. 3(a) and 3(b), a write operation in the magnetic domain wall motion memory 1 of this embodiment is described. FIGS. 3(a) and 3(b) show the final states that are observed when upward magnetization and downward magnetization are written in each magnetic memory nanowire $10_i$. In a case where upward magnetization is written, a write current Iw is applied rightward as shown in FIG. 3(a), or in the direction from the electrode 40a toward the electrode 40b via the write magnetic wire 30. Electrons then flow leftward in the drawing, and magnetic domain walls 32 formed in the write magnetic wire 30 move leftward due to spin transfer torque. As a result, in the write magnetic wire 30, the regions having the same magnetization directions as the respective pinning portions $35_i$ (i=1, 2, 3, and 4) expand leftward (FIG. 3(a)). The magnetization direction toward a magnetic memory nanowire $10_i$ (i=1, 2, or 3) adjacent to the write magnetic wire 30 is oriented in the magnetization direction of the pinning portion $35_{i+1}$ to the right of the magnetic memory nanowire $10_i$. As a result, the magnetization in the region of the magnetic memory nanowire $10_i$ adjacent to the write magnetic wire 3 via the intermediate joining portion $20_i$ is oriented in the same direction (FIG. 3(a)).

In a case where downward magnetization is written, on the other hand, the write current Iw is applied leftward, and, in the write magnetic wire 30, the regions having the same magnetization directions as the respective pinning portions $35_i$ (i=1, 2, 3, and 4) expand rightward. As a result, the magnetization direction of each magnetic memory nanowire $10_i$ (i=1, 2, or 3) becomes the same as the magnetization direction of the pinning portion $35_i$ to the left of the magnetic memory nanowire $10_i$ in FIG. 3(b). Accordingly, the magnetization in the regions of the magnetic memory nanowires $10_1$, $10_2$, and $10_3$ adjacent to the write magnetic wire 30 via the intermediate joining portions $20_i$ can be reversed or recorded by adjusting the direction of the write current Iw.

The pinning portions $35_1$, $35_2$, $35_3$, and $35_4$ are located on the opposite side of the write magnetic wire 30 from the magnetic memory nanowires $10_1$, $10_2$, and $10_3$ in FIG. 2, but may be located on the same surface or the same side surface of the write magnetic wire 30 as the magnetic memory nanowires $10_1$, $10_2$, and $10_3$. Likewise, the write electrodes 40a and 40b are attached to the lower surface of the write magnetic wire 30 in FIG. 2, but may be located on the upper surface or a side surface. Also, the write magnetic wire 30 is located above the magnetic memory nanowires $10_1$, $10_2$, and $10_3$ in FIG. 2, but may be located below the magnetic memory nanowires $10_1$, $10_2$, and $10_3$.

The cross-section of each of the magnetic memory nanowires $10_1$, $10_2$, and $10_3$ and the write magnetic wire 30 taken along a line perpendicular to the extending direction thereof has a rectangular shape, a square shape, an elliptical shape, a circular shape, or a trapezoidal shape, for example. The widths thereof or the lengths in the transverse direction in cross-section are preferably 5 nm to 100 nm, and the thicknesses thereof or the lengths in the longitudinal direction in cross-section are preferably several nanometer to 100 nm. The width of the write magnetic wire 30 may range from a size equivalent to one bit to a size equivalent to several bits in the magnetic memory nanowires $10_1$, $10_2$, and $10_3$.

Figure 4:
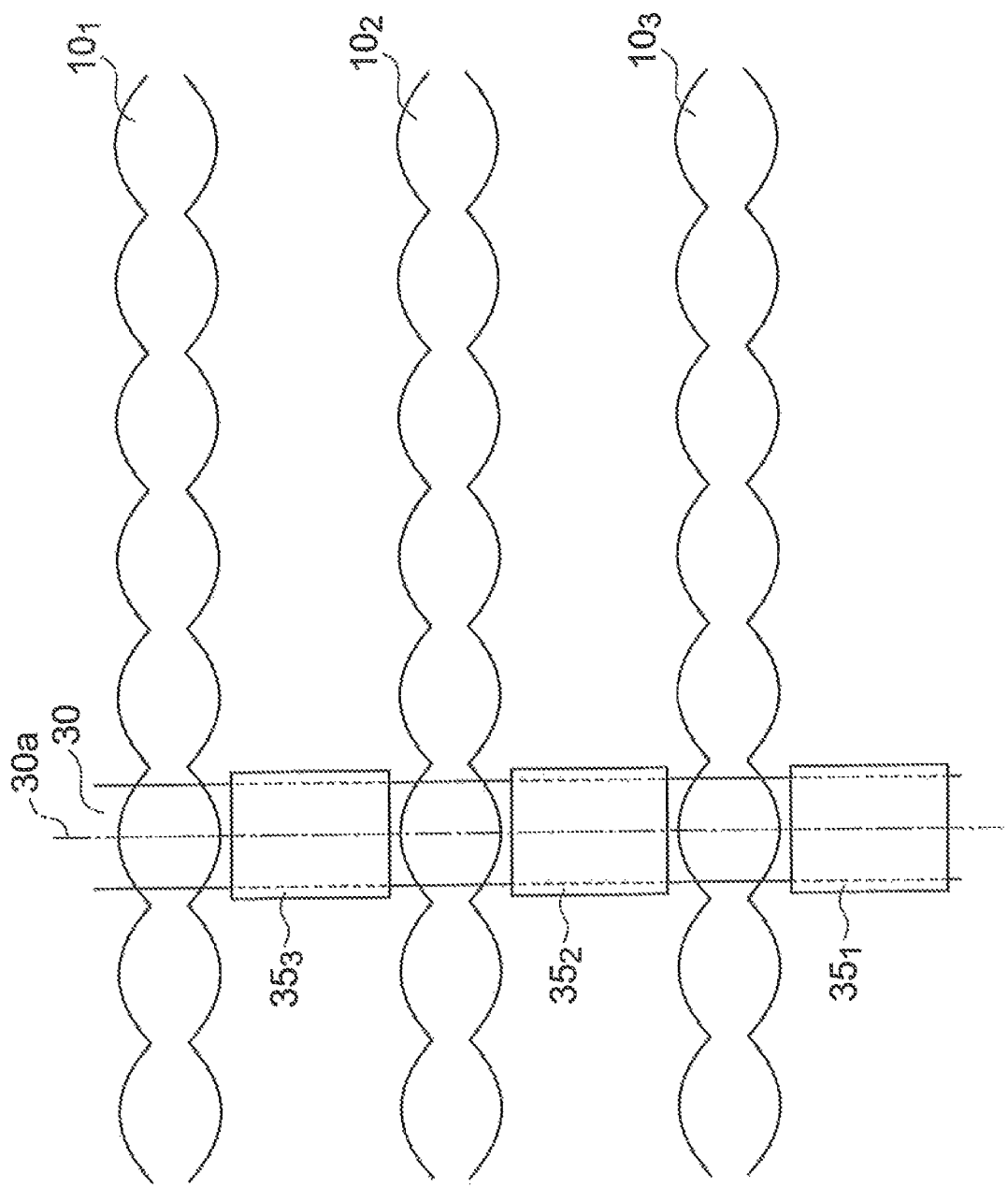
FIG. 4 is a diagram for explaining the shapes of magnetic memory nanowires and a write magnetic wire.
Figure 5:
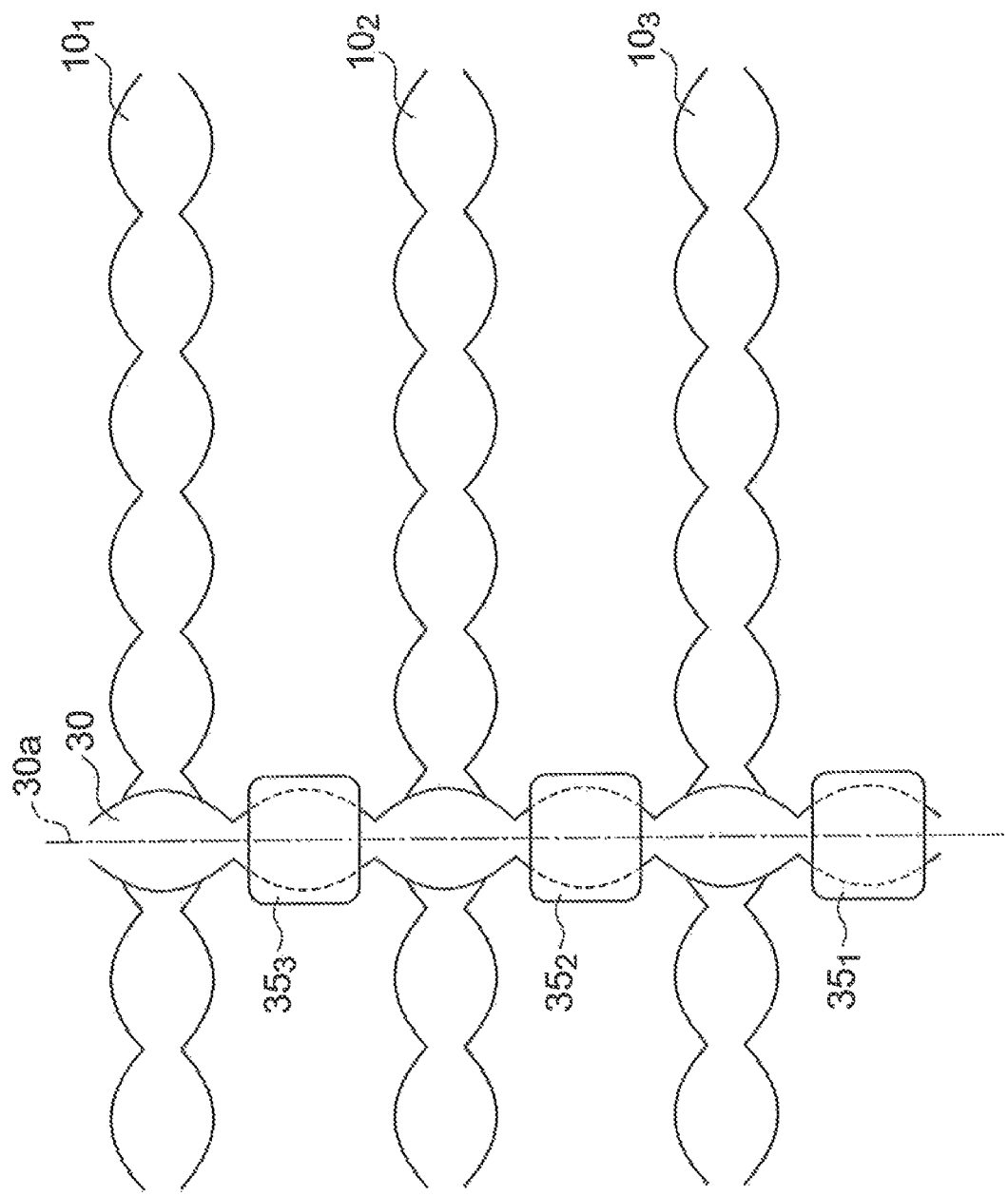
FIG. 5 is a diagram for explaining the shapes of magnetic memory nanowires and a write magnetic wire.

As shown in FIGS. 4 and 5, the external shapes of the magnetic memory nanowires $10_1$, $10_2$, and $10_3$ and the write magnetic wire 30 may have narrower portions that appear cyclically in the extending direction. With the narrower portions appearing in the extending direction, controlling the positions of magnetic domain walls becomes easier. In a case where the magnetic memory nanowires $10_1$, $10_2$, and $10_3$ have narrower portions, the center line $30a$ of the write magnetic wire 30 is placed on the thickest portions of the magnetic memory nanowires $10_1$, $10_2$, and $10_3$, so that writing can be certainly performed. Not only that, the width of the write magnetic wire 30 can be made smaller than each narrower portion, and the write current can be made smaller.

Each of the magnetic memory nanowires $10_1$, $10_2$, and $10_3$ and the write magnetic wire 30 can be formed with a rare earth-transition metal amorphous alloy film, a multilayer film, or a perpendicular magnetization film made of an ordered alloy of a transition metal and Pt or Pd.

The rare earth-transition metal amorphous alloy film is a ferrimagnetic material made of an alloy of a rare earth-transition metal and a $3d$ transition metal, and is formed with at least one element selected from the group consisting of Tb (terbium), Dy (dysprosium), and Gd (gadolinium), and at least one element selected from the group of transition metals. Specific examples of such alloys include TbFe, TbCo, TbFeCo, DyTbFeCo, GdTbCo, GdFeCo, and the like. The rare earth-transition metal amorphous alloy film may also contain an additional element such as B (boron).

The multilayer film may be a Co/Ni multilayer film, a Co/Pd multilayer film, a Co/Pt multilayer film, or the like.

The ordered alloy is preferably an alloy formed with at least one element selected from the group consisting of Fe, Co, and Ni, and at least one element selected from the group consisting of Pt and Pd. For example, examples of ordered alloys having $L_{10}$ crystal structures include $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, $Co_{30}Ni_{20}Pt_{50}$, and the like. These ordered alloys are not limited to the above composition ratios. Magnetic anisotropy energy and saturation magnetization can be adjusted by adding an impurity element such as Cu, Cr, or Ag to those ordered alloys, and large magnetic anisotropy energy can be easily obtained. If a Hensler alloy is used as the ordered alloy, the shift current can be reduced, Magnetic domain wall characteristics can be adjusted when the magnetic memory nanowires $10_1$, $10_2$, and $10_3$ and the write magnetic wire 30 include at least one layer of any of the above materials, and a combination such as TbFeCo/CoFeB, GdFeCo/Ru/TbFeCo, or TbFeCo/CoFeB/Ru/CoFeB is used. The magnetic memory nanowires $10_1$, $10_2$, and $10_3$ and the write magnetic wire 30 may be made of different materials and have different structures depending on characteristics.

Figure 6:
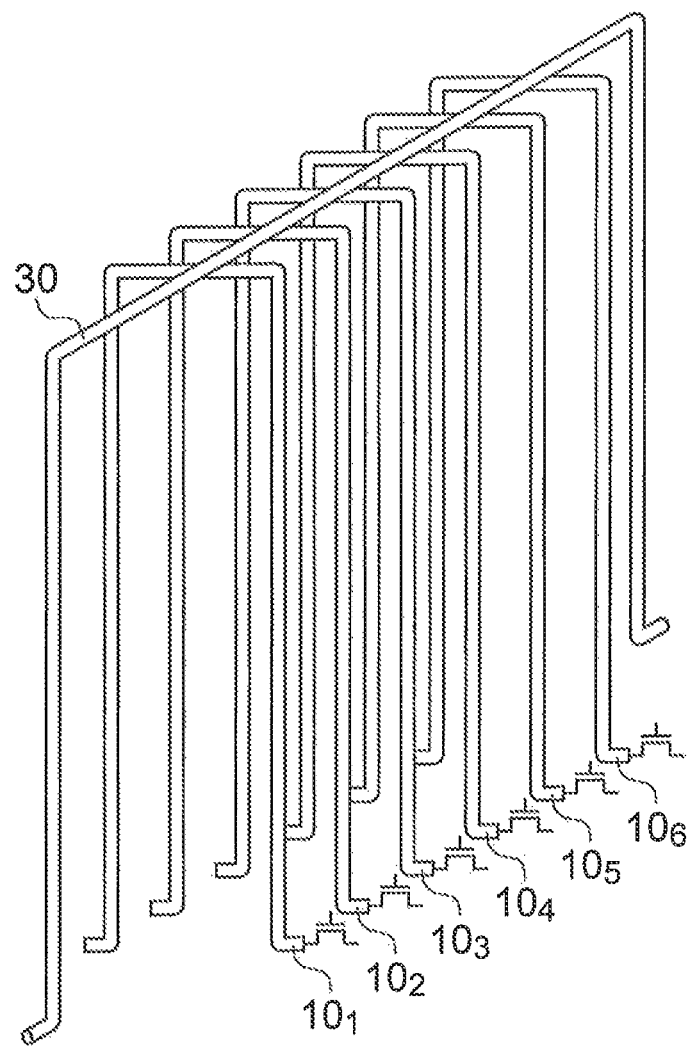
FIG. 6 is a perspective view of a magnetic domain wall motion memory according to a modification of the embodiment.

The magnetic memory nanowires $10_1$, $10_2$, and $10_3$ are located near the write magnetic wire 30, and are positioned parallel to one another. The write magnetic wire 30 is preferably intersecting with the magnetic memory nanowires $10_1$, $10_2$, and $10_3$, so as to increase the recording density as the memory density, and achieve a larger capacity. The magnetic memory nanowires $10_1$, $10_2$, and $10_3$ may be provided in the substrate surface as shown in FIG. 1, but may have vertical structures as in the modification shown in FIG. 6. With such arrangement, an even larger capacity can be achieved. In FIG. 6, the pinning portions and the intermediate joining portions are not shown. Also, in FIG. 6, the write magnetic wire 30 is provided on magnetic memory nanowires $10_1$, $10_2$, $10_3$, $10_4$, $10_5$, and $10_6$. In this case, the write magnetic wire 30 is also preferably intersecting with the magnetic memory nanowires $10_1$, $10_2$, $10_3$, $10_4$, $10_5$, and $10_6$ at the respective intersection points.

The pinning portions $35_1$, $35_2$, $35_3$, and $35_4$ have the function of locally pinning the magnetization of the adjacent write magnetic wire 30. The pinning portions $35_1$, $35_2$, $35_3$, and $35_4$ can be made of the same magnetic material as that of the magnetic memory nanowires $10_1$, $10_2$, and $10_3$ or the write magnetic wire 30. Alternatively, an antiferromagnetic material may be used for the pinning portions $35_1$, $35_2$, $35_3$, and $35_4$. To form pinning portions including ferromagnetic layers having opposite magnetization directions, ferromagnetic layers having two coercive forces that differ from each other may be formed. According to an example of such a method, ferromagnetic layers made of different materials are formed, or magnetic anisotropy is changed through ion irradiation.

Alternatively, the magnetization of the write magnetic wire 30 adjacent to pinning portions can be switched by changing the combinations of the spin polarization direction and the magnetization direction in the pinning portions. For example, adjacent pinning portions are formed by using rare earth-transition metals of rare earth rich type and transition metal rich type, and initialization is performed by applying a large external magnetic field to the pinning portions. In this manner, the magnetization direction of the write magnetic wire 30 in contact with the pinning portions can be reversed.

Figure 7A:
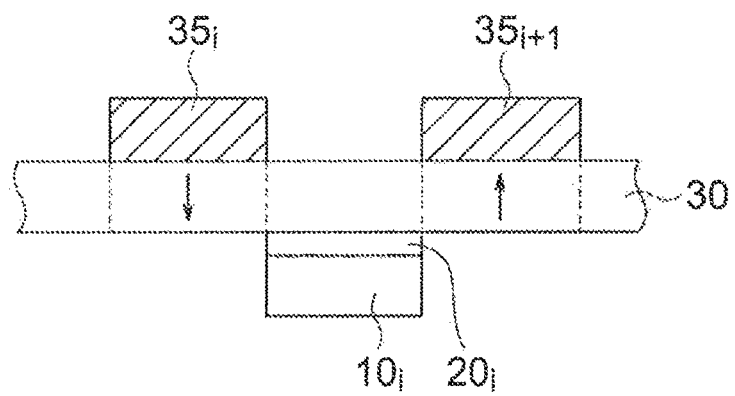
FIGS. 7(a) and 7(b) are cross-sectional views for explaining the structures of pinning portions.
Figure 7B:
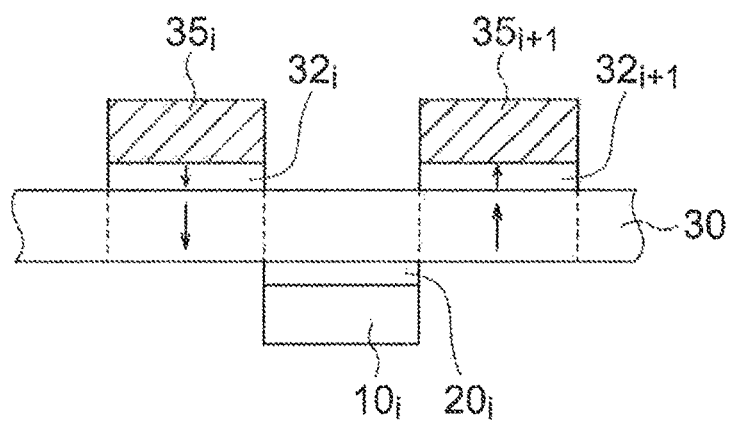

The magnetization direction of the write magnetic wire 30 in contact with pinning portions can also be switched by forming the adjacent pinning portions with antiferromagnetic materials having different Neel temperatures. For example, as shown in FIG. 7($a$), antiferromagnetic materials having different Neel temperatures are used as pinning portions $35_i$ and $35_{i+1}$ between which a magnetic memory nanowire $10_i$ (i=1, 2, or 3) is interposed via the write magnetic wire 30. With this arrangement, the regions of the write magnetic wire 30 in contact with the respective adjacent pinning portions $35_i$ and $35_{i+1}$ can be made to have opposite magnetization directions. In this case, ferromagnetic layers $32_i$ and $32_{i+1}$ may be provided between the write magnetic wire 30 and the respective pinning portions $35_i$ and $35_{i+1}$, as shown in FIG. 7($b$). With this arrangement, the manufacturing becomes easier.

Figure 8:
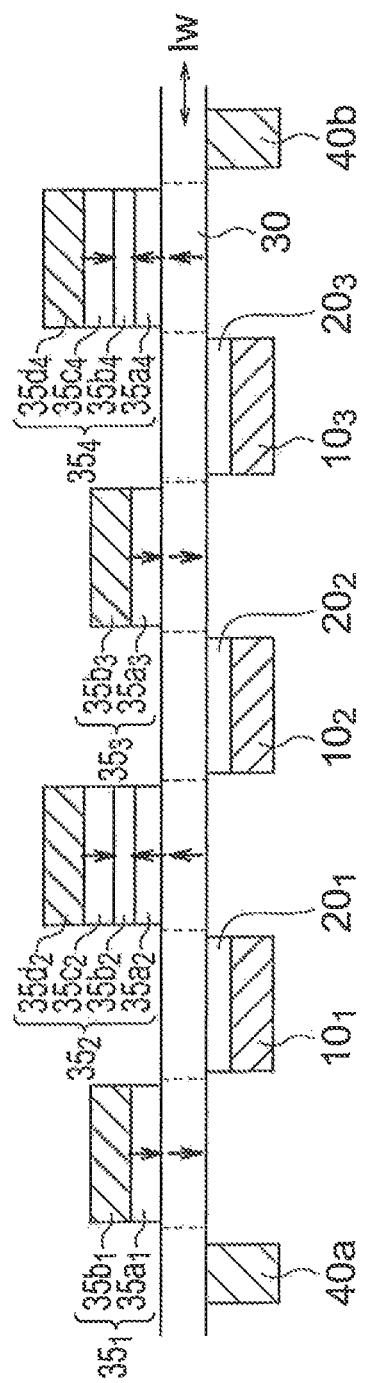
FIG. 8 is a cross-sectional view for explaining the structures of pinning portions.

As shown in FIG. 8, there is a method for pinning magnetization in opposite directions by forming pinning portions $35_2$ and $35_4$ with multilayer films that include a nonmagnetic layer made of Ru or the like and have artificial antiferromagnetic coupling therein, and forming the other pinning portions $35_1$ and $35_3$ with magnetic layers $35a_1$ and $35a_3$ and antiferromagnetic layers $35b_1$ and $35b_3$ formed on the respective magnetic layers $35a_1$ and $35a_3$. Each pinning layer $35_j$ (j=2 or 4) has a stack structure formed by stacking a magnetic layer $35a_j$, a nonmagnetic layer $35b_j$, a magnetic layer $35c_j$, and an antiferromagnetic layer $35d_j$ in this order, and the magnetic layer $35a_j$ and the magnetic layer $35c_j$ are antiferromagnetically coupled via the nonmagnetic layer $35b_j$. The same effects as above can also be achieved, even if all the magnetization directions shown in FIG. 8 are reversed.

Figure 9:
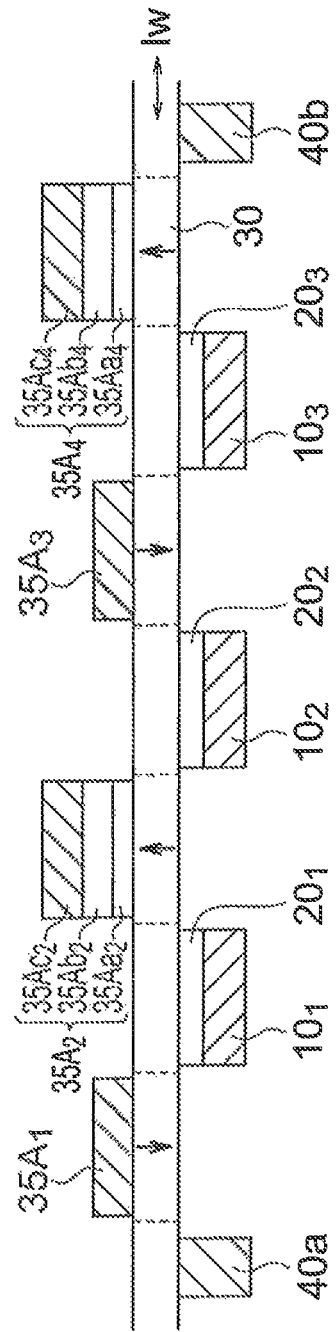
FIG. 9 is a cross-sectional view for explaining the structures of pinning portions.

Furthermore, as shown in FIG. 9, pinning portions $35A_1$ and $35A_3$ may be antiferromagnetic layers, and the other pinning portions $35A_2$ and $35A_4$ may be formed by stacking nonmagnetic layers $35Aa_2$ and $35Aa_4$ made of Ru or the like, ferromagnetic layers $35Ab_2$ and $35Ab_4$, and antiferromagnetic layers $35Ac_2$ and $35Ac_4$, respectively, in this order. With this arrangement, the magnetization directions in the regions of the write magnetic wire 30 in contact with adjacent pinning portions $35A_i$ and $35A_{i+1}$ can be locally made antiparallel to each other. The same effects as above can also be achieved, even if all the magnetization directions shown in FIG. 9 are reversed.

The size of each pinning portion $35_i$ (i=1, 2, 3, or 4) in the extending direction of the write magnetic wire 30 is set within such a range that a pinning portion $35_i$ and the nearest magnetic memory nanowires $10_i$ and $10_{i+1}$ do not partially overlap when the pinning portion $35_i$ and the nearest magnetic memory nanowires $10_i$ and $10_{i+1}$ are projected onto the write magnetic wire 30, as shown in FIG. 2. More specifically, the size of each pinning portion $35_i$ in the extending direction of the write magnetic wire 30 is set so that the contact faces between the pinning portion $35_i$ and the nearest magnetic memory nanowires $10_i$ and $10_{i+1}$ do not overlap when projected on a plane including the write magnetic wire 30. So as to appropriately control the magnetization of the write magnetic wire 30, the size of each pinning portion $35_i$ (i=1, 2, 3, or 4) in the direction (the width direction of the write magnetic wire 30) perpendicular to the extending direction of the write magnetic wire 30 is preferably equal to the width of the write magnetic wire 30 in the contact face between each pinning portion $35_i$ and the write magnetic wire 30, or larger than the width of the write magnetic wire 30 as shown in FIG. 4 or 5. The cross-section of each pinning portion $35_i$ has a rectangular shape, a square shape, or a trapezoidal shape.

So as to transmit the information about the magnetization of the write magnetic wire 30 to the magnetic memory nanowires, each intermediate joining portion $20_i$ (i=1, 2, or 3) can be made of a material that exhibits interlayer exchange coupling, an insulating magnetic material, or a magnetic semiconductor material. The material that exhibits interlayer exchange coupling may be Ru, Ir, Pt, Cu, or the like. Where the intermediate joining portions are made of an insulating magnetic material, the write current can be prevented from detouring into the magnetic memory nanowires, and accordingly, the use of an insulating magnetic material is preferable for the circuit configuration. The insulating magnetic material may be an oxide containing at least one element selected from the group consisting of Fe, Co, and Ni, a Mn-based oxide, an oxide to which at least one element selected from the group consisting of Fe, Co, and Ni is added, or $CrO_2$, for example. Those insulating magnetic materials may have somewhat poor insulating properties and have semiconductive properties due to oxygen defects, as long as the resistance is high. The magnetic semiconductor material may be Si to which at least one element selected from the group consisting of Mn, Fe, Co, and Ni is added, a compound semiconductor, or an oxide semiconductor.

Figure 10A:
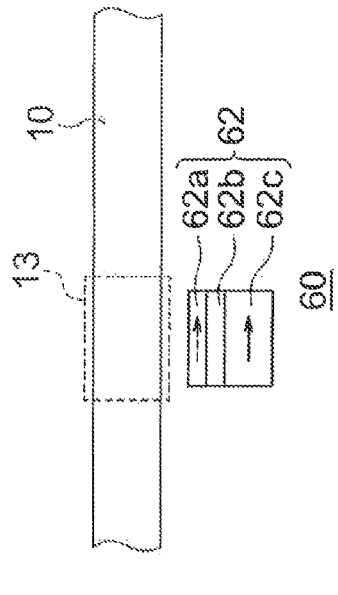
FIGS. 10(a) through 10(d) are cross-sectional views for explaining the structures of read units.

As shown in FIG. 1, a read unit 60 is provided for each magnetic memory nanowire $10_i$ (i=1, 2, or 3). The magnetization direction of a bit that has moved to the corresponding position (the target cell) in the magnetic memory nanowire is read by the read unit 60. As shown in FIG. 10(a), in the read unit 60, a magnetic electrode 61b may be provided in contact with the magnetic memory nanowire 10 via a tunnel barrier layer 61a, so that a structure for reading signals as tunnel magnetoresistive effects (TMR) can be used. The tunnel barrier layer 61a may be made of a material such as aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, $Cr_2O_3$, or graphite. The magnetic electrode 61b can be made of one of the materials described above as the materials for the magnetic memory nanowires 10.

Figure 10B:
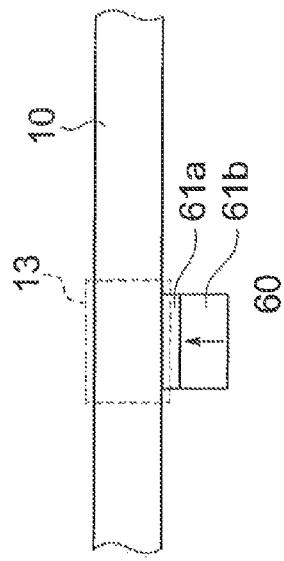

As shown in FIG. 10(b), in the read unit 60, a TMR device 62 located in a position electrically independent of the magnetic memory nanowire 10 can be used as a sensor, for example. This TMR device 62 has a structure in which a tunnel barrier layer 62b is interposed between a magnetic layer 62a and a magnetic electrode 62c, and the magnetic layer 62a is located on the side of the magnetic memory nanowire 10. The position in which the TMR device 62 is located is obliquely above or obliquely below the magnetic memory nanowire 10 in a cross-sectional view of the magnetic memory nanowire, so that a conventional in-plane magnetization film can be used as the TMR device 62. Alternatively, the TMR device 62 may be located on a side surface at a distance from the magnetic memory nanowire 10. In that case, perpendicular magnetization is preferably induced.

Figure 10C:
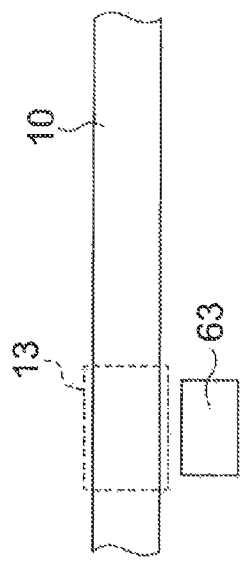
Figure 10D:
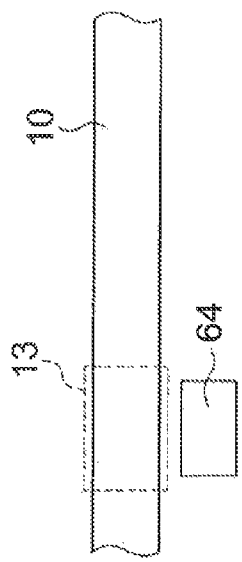

As shown in FIG. 10(c), in the read unit 60, a detection line 63 may be provided at a distance from the magnetic memory nanowire 10, so that the magnetization direction of the target cell 13 can be read by using the electromotive force induced in the detection line 63 when a domain wall moves, for example. As shown in 10(d), a spin-wave transmission line 64 may be provided at a distance from or in contact with the magnetic memory nanowire 10, so that the magnetization direction of the target cell 13 can be detected as a spin-wave signal, for example. Other than the above methods, reading can be performed in a non-local manner or the like.

Example 1

Referring now to FIGS. 11(a) through 12(c), a method of manufacturing a magnetic domain wall motion memory according to this embodiment is described as Example 1 of this embodiment. By the manufacturing method of Example 1, the magnetic domain wall motion memory shown in FIG. 1 or 8 is manufactured, for example. FIGS. 11(a) through 12(c) are cross-sectional views illustrating the manufacturing procedures in a case where each magnetic memory nanowire 10 has a linear shape. Those cross-sectional views are taken along the section line A-A defined in FIG. 1.

First, a Si substrate 100 having a thermally-oxidized film 110 including electrode interconnects (not shown) for reading and writing is placed into an ultrahigh vacuum sputtering system. A 10-nm thick TbFeCo film 10 to be the magnetic memory nanowires, and a 4-nm thick $(NiZn)Fe_2O_4$ film 20 to be the intermediate joining portions are sequentially formed on the substrate 100 via a buffer layer (not shown) (FIG. 11(a)).

A resist (not shown) is applied onto the film 20 to be the intermediate joining portions, and the resist is subjected to exposure and development with the use of an EB lithography apparatus, to form a mask (not shown) from the resist. Ion milling is performed with the mask, to process the TbFeCo film 10 to be the magnetic memory nanowires into nanowires of approximately 20000 nm×20 nm. The regions surrounding the nanowires are filled with an insulator such as a $SiO_2$ layer 25, and the mask is removed. In this manner, the magnetic memory nanowires 10 are formed (FIG. 11(b)).

Figure 11A:
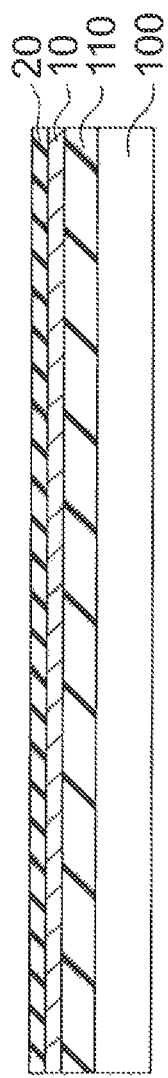
FIGS. 11(a) through 11(c) are cross-sectional views for explaining procedures according to a method of manufacturing the magnetic domain wall motion memory of the embodiment.
Figure 11B:
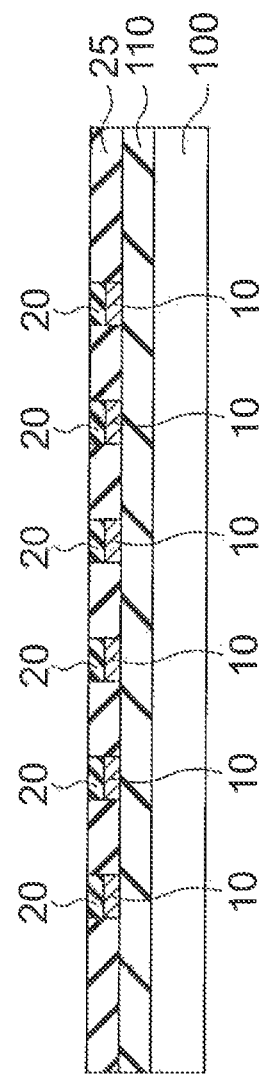
Figure 11C:
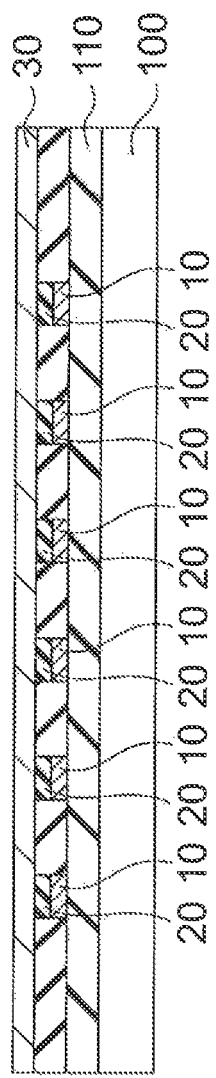

The substrate 100 is then placed back into the ultrahigh vacuum sputtering system, and a film stack 30 in which a 15-nm thick TbFeCo film and a 1-nm thick Pt film are sequentially stacked to form the write magnetic wire is formed (FIG. 11(c)). Here, the Pt film is provided for protecting the TbFeCo film. A resist (not shown) is then applied onto the film stack 30, and the resist is subjected to exposure and development with the use of the EB lithography apparatus, to form a mask (not shown) into the shape of a nanowire from the resist. Ion milling is performed on the film stack with the mask, to process the film stack into a nanowire. The regions surrounding the nanowire are filled with an insulator such as a $SiO_2$ layer (not shown). The mask is then removed, to form the write magnetic wire 30. In this manner, the write magnetic wire 30 extending horizontally in FIG. 11(c) is formed.

A resist (not shown) is then applied onto the substrate 100, and the resist is subjected to exposure and development with the use of the EB lithography apparatus, to form a mask (not shown). The substrate is again placed back into the ultrahigh vacuum sputtering system, and pre-sputtering is performed on the surface, After that, a 1.4-nm thick FeCo film 35a, a 10-nm thick IrMn film 35b, and a 5-nm thick Ta film 35c are sequentially formed. The resist is then lifted off, to form pinning portions $35_1$, $35_3$, $35_5$, and $35_7$, which are half the pinning portions to be formed eventually (FIG. 12(a)).

A resist (not shown) is again applied onto the substrate 100, and the resist is subjected to exposure and development with the use of the EB lithography apparatus, to form a mask (not shown) from the resist. A 1-nm thick CoFeB film 36a, a 0.9-nm thick Ru film 36b, a 1-nm thick CoFe film 36c, a 10-nm thick IrMn film 36d, and a 5-nm thick Ta film 36e are sequentially formed. The resist is then lifted off, to form pinning portions $35_2$, $35_4$, and $35_6$, which are the rest of the pinning portions (FIG. 12(b)).

Lastly, as shown in FIG. 12(c), the pair of electrodes 40a and 40b for writing into the write magnetic wire 30, and the pairs of electrodes (not shown) for shift operations in the respective magnetic memory nanowires 10 are formed. These electrodes are formed as follows. A resist (not shown) is applied onto the surface shown in FIG. 12(b), and the resist is subjected to exposure and development with the use of the EB lithography apparatus, to form a mask (not shown) from the resist. The mask has openings in positions where the electrodes are to be formed. With this mask, ion milling and reactive ion etching are performed on the positions where the electrodes are to be formed on the surface shown in FIG. 12(b). As a result, the openings are formed. The openings thus formed are then filled with an electrode material, to form the electrodes, So as to protect the pinning portions $35_1$ through $35_7$, a $SiO_2$ film 120 is formed to cover the pinning portions $35_1$ through $35_7$.

In the above manner, a memory of domain wall motion type including the write magnetic wire 30 can be manufactured.

Other than $SiO_2$ used in the above example, aluminum oxide (AlOx), aluminum nitride (AlN), magnesium oxide (MgO), or magnetism nitride can be used as the insulator.

Example 2

Figure 13:
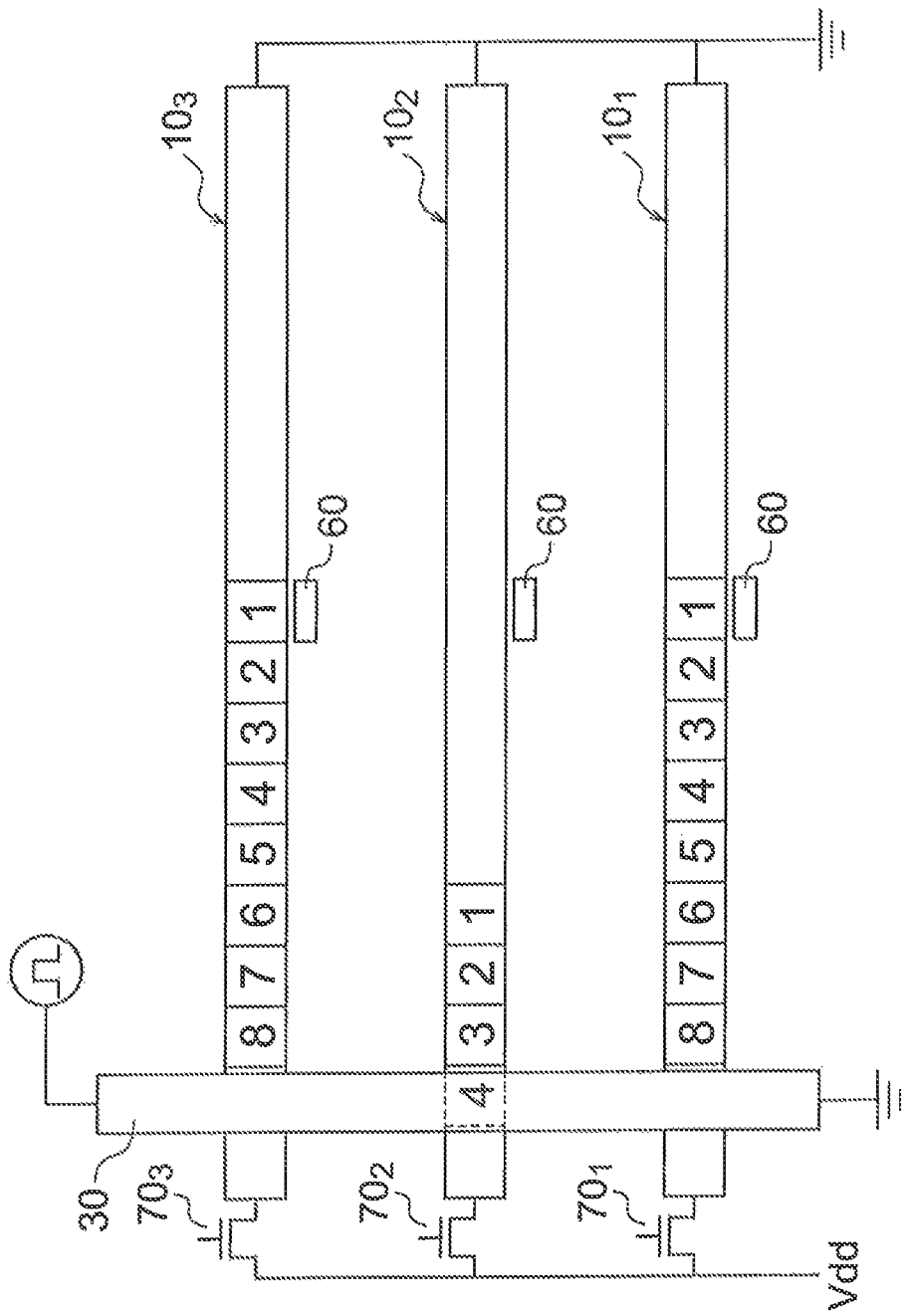
FIG. 13 is a diagram for explaining a recording method for magnetic memory nanowires.

Referring now to FIG. 13, a method of recording by performing writing on magnetic memory nanowires with a single write magnetic wire is described as Example 2 of this embodiment, FIG. 13 shows an example case where three magnetic memory nanowires $10_1$ through $10_3$ are provided. In this example, a select transistor $70_i$ is connected to one end of each corresponding magnetic memory nanowire $10_i$. By this recording method, writing is simultaneously performed on all the magnetic memory nanowires $10_1$ to $10_3$ that intersect with the write magnetic wire 30 and have pinning portions corresponding thereto. In unselected magnetic memory nanowires, which are the magnetic memory nanowires $10_1$ and $10_3$ in this example, written bits are moved away from the points of intersection with the write magnetic wire 30 in advance, so that the already written bits will not be overwritten. As for the selected magnetic memory nanowire $10_2$, a current pulse is applied to the write magnetic wire 30, and the shift current is applied to the magnetic memory nanowire $10_2$ via the select transistor $70_2$, to shift written bits. Write and shift operations are then repeated. A current in the form of a pulse is applied in some shift operations, and a current is continuously applied in the other shift operations. The former is particularly suitable in cases where the magnetic memory nanowires each have narrower portions, and excels in controlling domain wall positions. If a shift current is continuously applied during write operations, on the other hand, high-speed operations can be performed, and a magnetic domain wall motion memory with a high transfer rate can be realized.

As described so far, this embodiment can provide a magnetic domain wall motion memory that is capable of writing while consuming less power and achieving a larger capacity, and a write method for the magnetic domain wall motion memory.

In the embodiments, each of the pinning portions may include a magnetic layer in contact with the write magnetic wire, and an antiferromagnetic layer located on the opposite side of the magnetic layer from the write magnetic wire, the antiferromagnetic layers of the adjacent pinning portions being different antiferromagnetic materials from each other.

In the embodiments, one of the adjacent pinning portions may include a first magnetic layer in contact with the write magnetic wire, and a first antiferromagnetic layer located on the opposite side of the first magnetic layer from the write magnetic wire, the other one of the adjacent pinning portions may include a second magnetic layer in contact with the write magnetic wire, a nonmagnetic layer located on the opposite side of the second magnetic layer from the write magnetic wire, a third magnetic layer located on the opposite side of the nonmagnetic layer from the write magnetic wire, and a second antiferromagnetic layer located on the opposite side of the third magnetic layer from the write magnetic wire, the second and third magnetic layers being antiferromagnetically coupled via the nonmagnetic layer.

In the embodiments, one of the adjacent pinning portions may include a first antiferromagnetic layer in contact with the write magnetic wire, the other one of the adjacent pinning portions may include a first magnetic layer in contact with the write magnetic wire, a nonmagnetic layer located on the opposite side of the first magnetic layer from the write magnetic wire, a second magnetic layer located on the opposite side of the nonmagnetic layer from the write magnetic wire, and a second antiferromagnetic layer located on the opposite side of the second magnetic layer from the write magnetic wire, the first and second magnetic layers being antiferromagnetically coupled via the nonmagnetic layer.

In the embodiments, the write magnetic wire may have an external shape with narrower portions appearing cyclically in an extending direction thereof.

A write method for the magnetic domain wall motion memory according to an embodiment, the write method may comprise writing a bit into the magnetic memory nanowire by applying a pulse current to the write magnetic wire.

A write method for the magnetic domain wall motion memory according to an embodiment, the write method may comprise: shifting a recording bit already written into an unselected magnetic memory nanowire to a region not overlapping with the write magnetic wire before applying a current to the write magnetic wire; and writing a bit into a selected magnetic memory nanowire by applying a current to the write magnetic wire after the shift.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic domain wall motion memory comprising:
a magnetic memory nanowire;
a write magnetic wire intersecting with the magnetic memory nanowire;
an intermediate joining portion provided in an intersection region between the write magnetic wire and the magnetic memory nanowire, the intermediate joining portion transferring, to the magnetic memory nanowire, information about magnetization of the write magnetic wire in the intersection region;
adjacent pinning portions placed on one of the same side and the opposite side of the write magnetic wire as and from the magnetic memory nanowire, the adjacent pinning portions being in contact with the write magnetic wire, the adjacent pinning portions having the magnetic memory nanowire interposed therebetween when projected onto the write magnetic wire, the adjacent pinning portions being located at a distance from each other, the distance being equal to or longer than a width of the magnetic memory nanowire in a direction parallel to an extending direction of the write magnetic wire;
a read unit attached to the magnetic memory nanowire;
a pair of first electrodes that applies a write current to the write magnetic wire, the first electrodes being attached to the write magnetic wire in such a manner that the magnetic memory nanowire and the adjacent pinning portions are interposed between the first electrodes when projected onto the write magnetic wire; and
a pair of second electrodes that applies a current for causing the magnetic memory nanowire to move a magnetic domain wall, the second electrodes being attached to the magnetic memory nanowire,
wherein contact faces of the write magnetic wire in contact with the adjacent pinning portions have magnetization configurations antiparallel to each other.

2. The memory according to claim 1, wherein the intermediate joining portion is made of an insulating magnetic material.

3. The memory according to claim 1, wherein the intermediate joining portion is made of a material that exhibits interlayer exchange coupling.

4. The memory according to claim 1, wherein the adjacent pinning portions include magnetic layers with magnetization configurations antiparallel to each other in regions in contact with the write magnetic wire.

5. The memory according to claim 4, wherein the adjacent pinning portions have different coercive forces from each other.

6. The memory according to claim 4, wherein the adjacent pinning portions are different magnetic materials from each other.

7. The memory according to claim 1, wherein the adjacent pinning portions include different antiferromagnetic materials from each other.

8. The memory according to claim 1, wherein the magnetic memory nanowire has an external shape with narrower portions appearing cyclically in the extending direction thereof.

9. A memory of domain wall motion type comprising:
N (N≥2) magnetic memory nanowires parallel to each other;
a write magnetic wire intersecting with the N magnetic memory nanowires;
intermediate joining portions provided in the respective intersection regions, the intermediate joining portions transferring, to the magnetic memory nanowires, information about magnetization of the write magnetic wire in the respective intersection regions between the write magnetic wire and the respective magnetic memory nanowires;
(N+1) pinning portions placed on one of the same side and the opposite side of the write magnetic wire as and from the magnetic memory nanowires, the pinning portions being in contact with the write magnetic wire, the pinning portions having the respective magnetic memory nanowires interposed therebetween when projected onto the write magnetic wire, adjacent ones of the pinning portions not being in contact with each other, adjacent ones of the pinning portions being located at a distance from each other, the distance being equal to or longer than a width of each of the magnetic memory nanowires in a direction parallel to an extending direction of the write magnetic wires;
read units attached to the respective magnetic memory nanowires;
a pair of first electrodes that applies a write current to the write magnetic wire, the first electrodes being attached to the write magnetic wire in such a manner that the N magnetic memory nanowires and the (N+1) pinning portions are interposed between the first electrodes; and
pairs of second electrodes that applies a current for causing the magnetic memory nanowires to move magnetic domain walls, the pairs of second electrodes being attached to the respective magnetic memory nanowires,
wherein contact faces of the write magnetic wire in contact with adjacent ones of the pinning portions have magnetization configurations antiparallel to each other.

10. The memory according to claim 9, wherein the intermediate joining portions are made of an insulating magnetic material.

11. The memory according to claim 9, wherein the intermediate joining portions are made of a material that exhibits interlayer exchange coupling.

12. The memory according to claim 9, wherein adjacent pinning portions of the pinning portions are magnetic layers having magnetization configurations antiparallel to each other in regions in contact with the write magnetic wire.

13. The memory according to claim 12, wherein the adjacent pinning portions have different coercive forces from each other.

14. The memory according to claim 12, wherein the adjacent pinning portions are different magnetic materials from each other.

15. The memory according to claim 9, wherein adjacent pinning portions of the pinning portions are different antiferromagnetic materials from each other.

16. The memory according to claim 9, wherein each of the pinning portions includes a magnetic layer in contact with the write magnetic wire, and an antiferromagnetic layer located on the opposite side of the magnetic layer from the write magnetic wire, the antiferromagnetic layers of the adjacent pinning portions being different antiferromagnetic materials from each other.

17. The memory according to claim 9, wherein
one of adjacent pinning portions of the pinning portions includes a first magnetic layer in contact with the write magnetic wire, and a first antiferromagnetic layer located on the opposite side of the first magnetic layer from the write magnetic wire,
the other one of the adjacent pinning portions includes a second magnetic layer in contact with the write magnetic wire, a nonmagnetic layer located on the opposite side of the second magnetic layer from the write magnetic wire, a third magnetic layer located on the opposite side of the nonmagnetic layer from the write magnetic wire, and a second antiferromagnetic layer located on the opposite side of the third magnetic layer from the write magnetic wire, the second and third magnetic layers being antiferromagnetically coupled via the nonmagnetic layer.

18. The memory according to claim 9, wherein
one of adjacent pinning portions of the pinning portions includes a first antiferromagnetic layer in contact with the write magnetic wire,
the other one of the adjacent pinning portions includes a first magnetic layer in contact with the write magnetic wire, a nonmagnetic layer located on the opposite side of the first magnetic layer from the write magnetic wire, a second magnetic layer located on the opposite side of the nonmagnetic layer from the write magnetic wire, and a second antiferromagnetic layer located on the opposite side of the second magnetic layer from the write magnetic wire, the first and second magnetic layers being antiferromagnetically coupled via the nonmagnetic layer.

19. The memory according to claim 9, wherein each of the magnetic memory nanowires has an external shape with narrower portions appearing cyclically in the extending direction thereof.

20. The memory according to claim 9, wherein the write magnetic wire has an external shape with narrower portions appearing cyclically in an extending direction thereof.

\* \* \* \* \*